United States Patent [19]
Galvin

[11] 4,053,943
[45] Oct. 11, 1977

[54] TECHNIQUE FOR DAMPING ELECTRONIC MODULE PRINTED WIRING BOARD

[75] Inventor: Lee Robert Galvin, Scottsdale, Ariz.

[73] Assignee: Motorola Inc., Schaumburg, Ill.

[21] Appl. No.: 651,654

[22] Filed: Jan. 22, 1976

[51] Int. Cl.$^2$ .............................................. H02B 1/62
[52] U.S. Cl. ..................................... 361/399; 188/1 B
[58] Field of Search .................. 317/101 DH; 188/1 B

[56] References Cited

U.S. PATENT DOCUMENTS

| | | | |
|---|---|---|---|
| 3,102,722 | 9/1963 | Hamontre | 188/1 B |
| 3,813,582 | 5/1974 | Gikow | 317/101 DH |

Primary Examiner—David Smith, Jr.
Attorney, Agent, or Firm—M. David Shapiro

[57] ABSTRACT

A vibration damping system for a printed circuit board in which laminated damping elements are remotely positioned from the printed circuit board.

The laminated damping elements are connected to the printed circuit board by post structural means fastened rigidly at each end to the printed circuit board and to the laminated damping element, respectively, for the purpose of transferring vibration energy from the printed circuit board to the damping element. The laminated damping elements comprise a high hysteresis bonding agent for bonding the laminate and for absorbing the vibration energy. The high hysteresis bonding agent is stressed in a shear mode for greatest energy absorption efficiency.

1 Claim, 2 Drawing Figures

TECHNIQUE FOR DAMPING ELECTRONIC MODULE PRINTED WIRING BOARD

FIELD OF THE INVENTION

The invention relates generally to a system for damping vibration energy in a printed circuit board by utilizing a high hysteresis elastomer in a remotely positioned damping laminate.

BACKGROUND OF THE INVENTION

Shock and vibration environments have dictated the use of techniques designed to protect electronic component parts which are exposed to those environments. One such technique which has been used on printed circuit boards comprises a laminate of a thin layer of high hysteresis elastomer between the circuit board and a second structural sheet member which may be made of the same or of a different material as the circuit board. This laminate acts to dampen vibration in the printed circuit board by absorption of much of the input energy by the elastomer. This energy is dissipated in the form of heat generated by shear stresses in the elastomer. Because of this energy conversion the vibration oscillation of the laminate is damped and, thus, the duration and amplitude of vibration are reduced. The high hysteresis elastomer may also be used as a bonding agent for the laminate.

There are at least two problems inherent in the above described prior art vibration control systems: First, one side of the printed circuit board is inaccessible after assembly. This makes testing and trouble finding more difficult. Second, assuming that a fault is located, it is very difficult to replace the faulty component due to the aforementioned inaccessibility.

SUMMARY OF THE INVENTION

In view of the problems caused by inaccessibility in prior art designs, these and other shortcomings are overcome in the present invention by utilizing a separate laminated structural member, remote from the printed circuit board to provide vibration damping for the printed circuit board. Post members are rigidly attached between the printed circuit board and the remotely positioned vibration damping members to transfer the vibration energy from the printed circuit board to the absorbing or damping member.

According to one aspect of the present invention, accessibility to the printed circuit board for testing and for trouble a shooting is provided by the remote positioning of damping laminates comprising a high hysteresis bonding agent.

According to another aspect of the invention, accessibility for repair of faulty printed circuits or faulty electronic components is facilitated by the remote positioning of damping laminates comprising a high hysteresis bonding agent.

According to still another aspect of the invention, energy from the vibrating printed circuit board is transferred to remotely positioned damping laminates by way of rigidly connecting posts which have cross sections which are small with respect to the printed circuit board area in order to utilize a maximum portion of the board area for the utilization of printed circuit patterns and the mounting of electronic components thereon.

According to a still further aspect of the invention, the laminated damping elements serve as covers for the planar surfaces of the printed circuit board.

These and other aspects of the invention will be better understood by inspection of the drawings, here summarized:

DETAILED DESCRIPTION OF THE INVENTION

Figure 1:
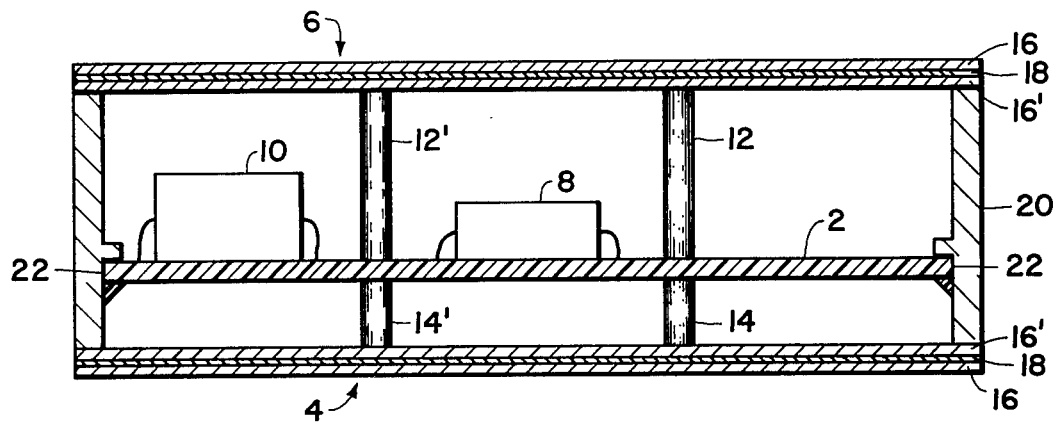
FIG. 1 illustrates in cross section a typical embodiment of the invention utilizing two laminated damping elements.

Referring to FIG. 1, it will be seen that printed circuit board 2 is positioned between and parallel to laminated damping elements 4 and 6. Damping element 6 is spaced sufficiently from printed circuit board 2 to allow clearance for electronic components 8, 10 mounted on printed circuit board 2. Of course, it is also possible to mount additional electronic components (not shown) on the opposite side of printed circuit board 2 by displacing damping element 4 sufficiently from printed circuit board 2.

Damping element 6 is connected to printed circuit board 2 by means of post members 12, 12'. Damping element 4 is connected to printed circuit board 2 by means of post members 14, 14'. The lengths of posts 12, 12', 14, 14' may be varied to accommodate different maximum heights of electronic components, such as 8, 10. Posts 12, 12', 14 and 14' are fastened at their extremities to damping elements 4 or 6 and to printed circuit board 2. A semiflexible epoxy or other suitable bonding agent may be used to obtain the structural connections. Alternately, mechanical fastening techniques may be utilized to provide the necessary connections.

Damping elements 4 and 6 may be similar or identical in structure. As shown in FIG. 1, damping elements 4 and 6 are identical and each comprise two outer layers or skins 16, 16' which may be made of thin aluminum or other suitable material. Aluminum skins 16, 16' may be from 0.008 to 0.016 inches thick but the invention is not limited to this dimensional range. Skins 16, 16' are bonded together by high hysteresis bonding agent 18 which may be a polyurethane material, but other suitable materials will be apparent to one skilled in the art. High hysteresis bonding agent 18 may be from 0.005 to 0.008 inches thick but the invention is not limited to this dimensional range.

Figure 2:
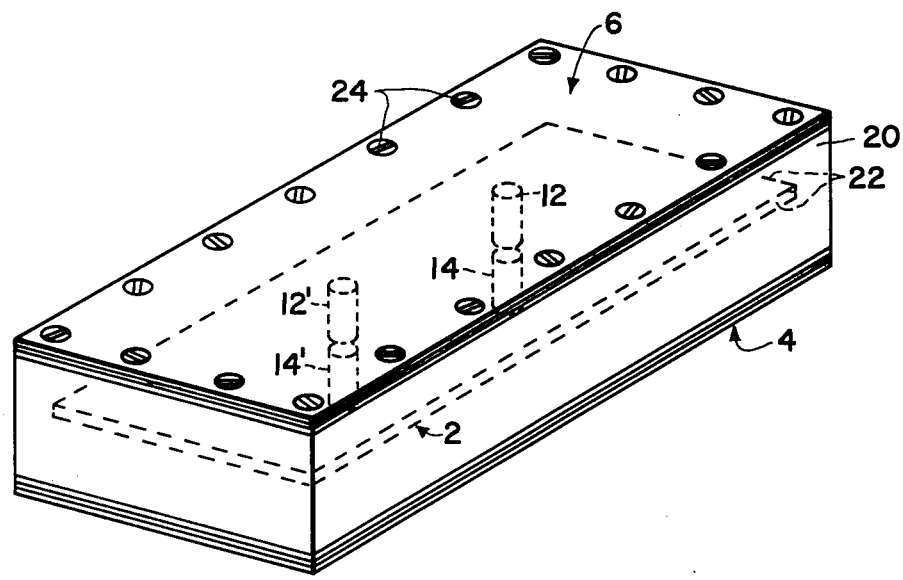
FIG. 2 shows an external view of the module of the embodiment of FIG. 1.

FIG. 2 illustrates a typical electronic module utilizing the damping system shown in cross section in FIG. 1. Damping elements 4, 6 also act as protective covers for printed circuit board 2 and the electronic components mounted thereon. Frame 20 provides a means for structurally integrating the system of the invention. Printed circuit board 2 may be bonded to frame 20 with a suitable bonding agent, such as epoxy, along perimeter 22 of printed circuit board 2, however, other fastening techniques, such as screws, may be used. Screws 24 may be used to fasten damping elements 4 and 6 to frame 20. If screws 24, or the equivalent (not shown), are used to fasten posts 12, 12', 14, 14' to damping elements 4 or 6, damping elements 4 and 6 are thereby easily removable for access to printed circuit board 2 and to the electronic components mounted thereon.

In use, any vibration energy induced in printed circuit board 2 is coupled by way of rigidly fastened post members 12, 12', 14, and 14' to damping means 4 and 6. High hysteresis bonding agent 18 is shear stressed considerably beyond its elastic limit and the vibration energy thus coupled therein is converted to heat energy which cannot be returned in the form of mechanical energy to printed circuit board 2 via posts 12, 12', 14 and 14'. Thus, it will be apparent to one skilled in the art that the vibration of printed circuit board 2 will be dampened by remotely positioned damping elements 4 and 6. It will also be apparent that damping elements 4 and 6 serve a secondary function as protective covers for printed circuit board 2 and the electronic components, such as 8, 10, mounted thereon.

It will also be apparent to one skilled in the art that while the invention has been illustrated utilizing two damping elements 4 and 6, there may be cases in which it would be desirable to utilize only one damping element. Further, although the illustrative embodiment of the invention in FIGS. 1 and 2 utilizes two posts 12, 12' to connect damping member 6 to printed circuit board 2 and two posts 14, 14' to connect damping member 4 to printed circuit board 2, more or less than two posts may be utilized in other designs and the number of posts utilized and the relative positions of posts on either side of printed cirucit board 2 may vary with the needs dictated by particular system design parameters.

By utilizing post members 12, 12', 14, 14' which have small cross sections in comparison with the area of printed circuit board 2, a very large portion of printed circuit board 2 area is available for mounting of electronic components and printed circuit wiring patterns.

Various other modifications and changes may be made to the present invention from the principles of the invention embodied above without departing from the spirit and scope thereof, as encompassed in the accompanying claims.

What is claimed is:

1. In an apparatus for damping printed circuit board vibration energy, the improvement comprising:
    at least one damping means for absorbing a portion of the vibration energy, said at least one damping means being positioned remote from and parallel to the printed circuit board and comprising a lamination including a layer of high hysteresis elastomer;
    at least one post means for connecting said at least one damping means to the printed circuit board, each of said at least one post means having two extremities, one of said extremities being fastened to the printed circuit board and the other of said extremities being fastened to said at least one damping means for providing mechanical energy transfer from the printed circuit board to said at least one damping means; and
    frame means for structurally integrating the printed circuit board and said at least one damping means, said frame means being fastened to the perimeter of the printed circuit board and to the perimeter of each of said at least one damping means.

* * * * *